(12) United States Patent
Yamana

(10) Patent No.: US 6,249,084 B1
(45) Date of Patent: Jun. 19, 2001

(54) ELECTROLUMINESCENCE DISPLAY PANEL AND PRODUCTION METHOD OF THE SAME

(75) Inventor: Shinji Yamana, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/231,087

(22) Filed: Jan. 14, 1999

(30) Foreign Application Priority Data

Jan. 14, 1998 (JP) .................................................. 10-006180

(51) Int. Cl.[7] ...................................................... H01J 1/62
(52) U.S. Cl. .............................................................. 313/504
(58) Field of Search ..................................... 313/504, 505, 313/506, 509, 499; 428/917

(56) References Cited

U.S. PATENT DOCUMENTS

| 4,824,221 | * | 4/1989 | Endo et al. | 350/357 |
| 5,294,869 | * | 3/1994 | Tang et al. | 313/504 |
| 5,773,931 | * | 6/1998 | Shi et al. | 313/504 |
| 6,107,736 | * | 8/2000 | Shi et al. | 313/504 |

FOREIGN PATENT DOCUMENTS 5-258859  10/1993 (JP) .
8-315981  11/1996 (JP) .

* cited by examiner

Primary Examiner—Nimeshkumar D. Patel
Assistant Examiner—Todd Reed Hopper

(57) ABSTRACT

An electroluminescence display panel includes: a substrate; a plurality of stripe-shaped lower electrodes formed adjacent and spaced apart from each other on the substrate so as to extend in a first direction; a plurality of stripe-shaped insulation films formed spaced apart from each other on the stripe-shaped lower electrodes so as to extend in a second direction which crosses the first direction, each of the stripe-shaped insulation films having a groove extending in the second direction; a plurality of organic films for providing electroluminescence formed over the plurality of stripe-shaped lower electrodes and the plurality of stripe-shaped insulation films, the plurality of organic films being separated from each other by the grooves of the stripe-shaped insulation films; and an upper electrode being formed from an electrically conductive film and formed on the organic film.

21 Claims, 11 Drawing Sheets

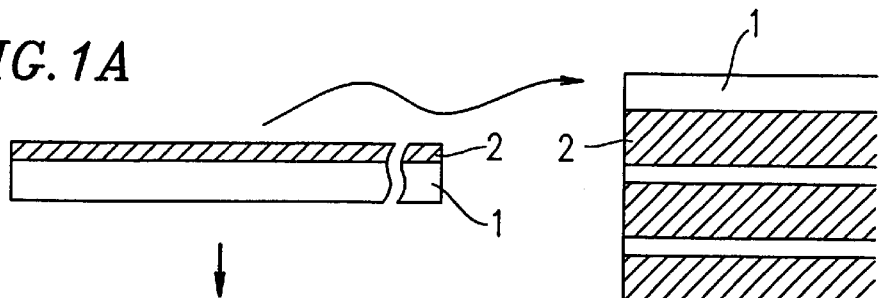
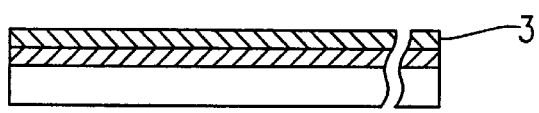
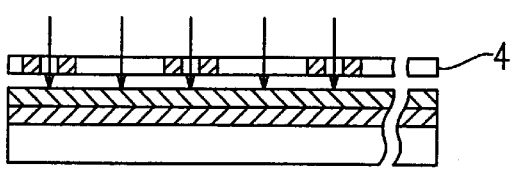
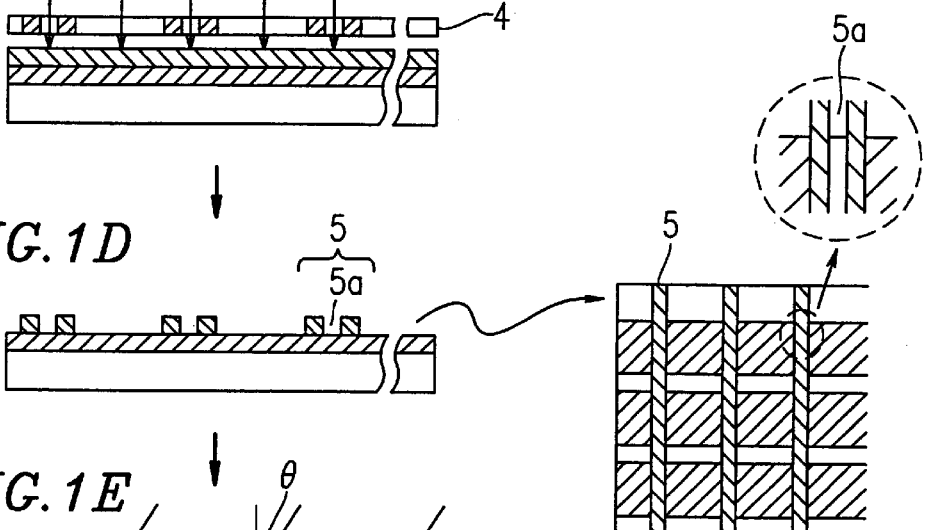
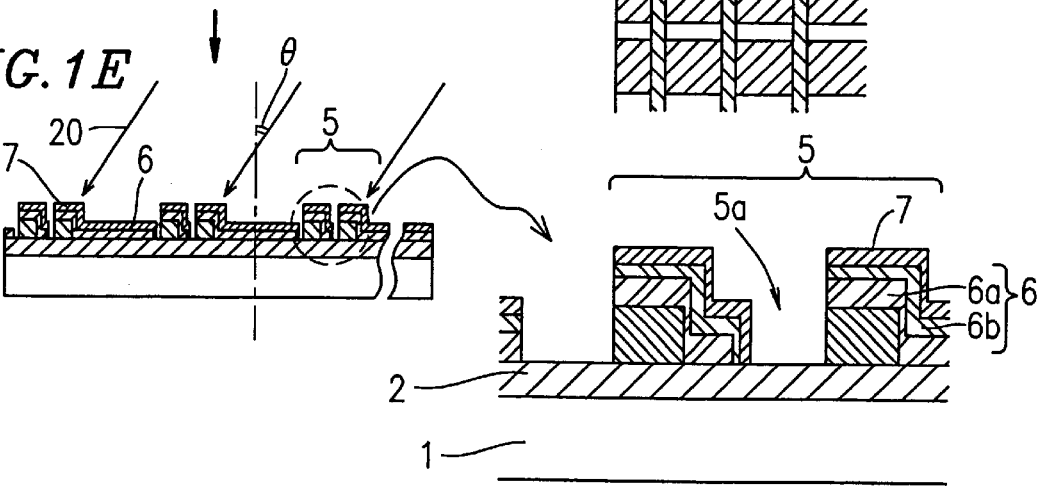

FIG. 5A
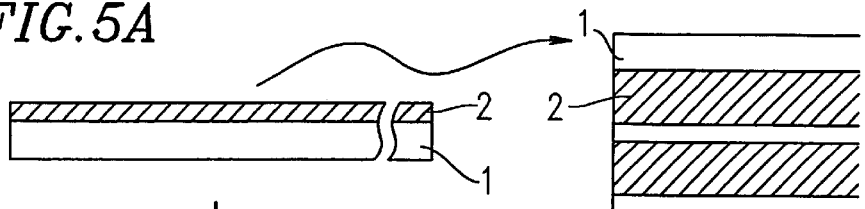
FIG. 5B
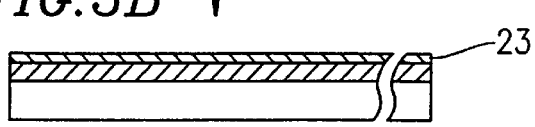
FIG. 5C
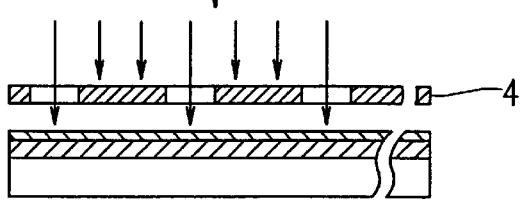
FIG. 5D
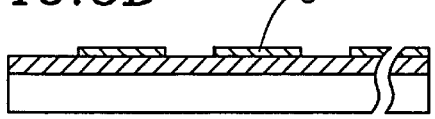
FIG. 5E
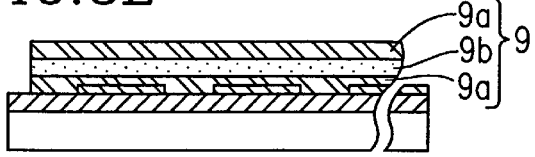
FIG. 5F
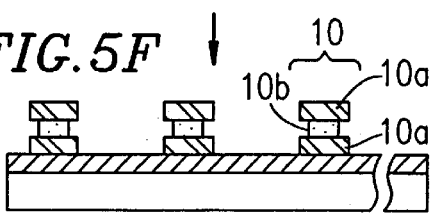
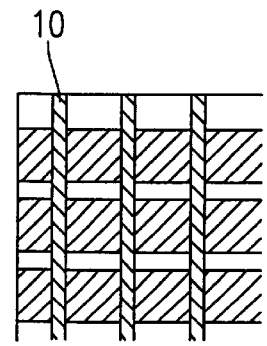
FIG. 5G
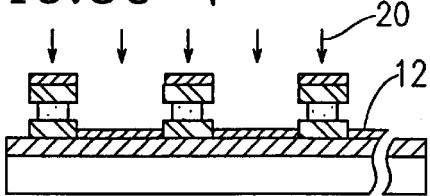

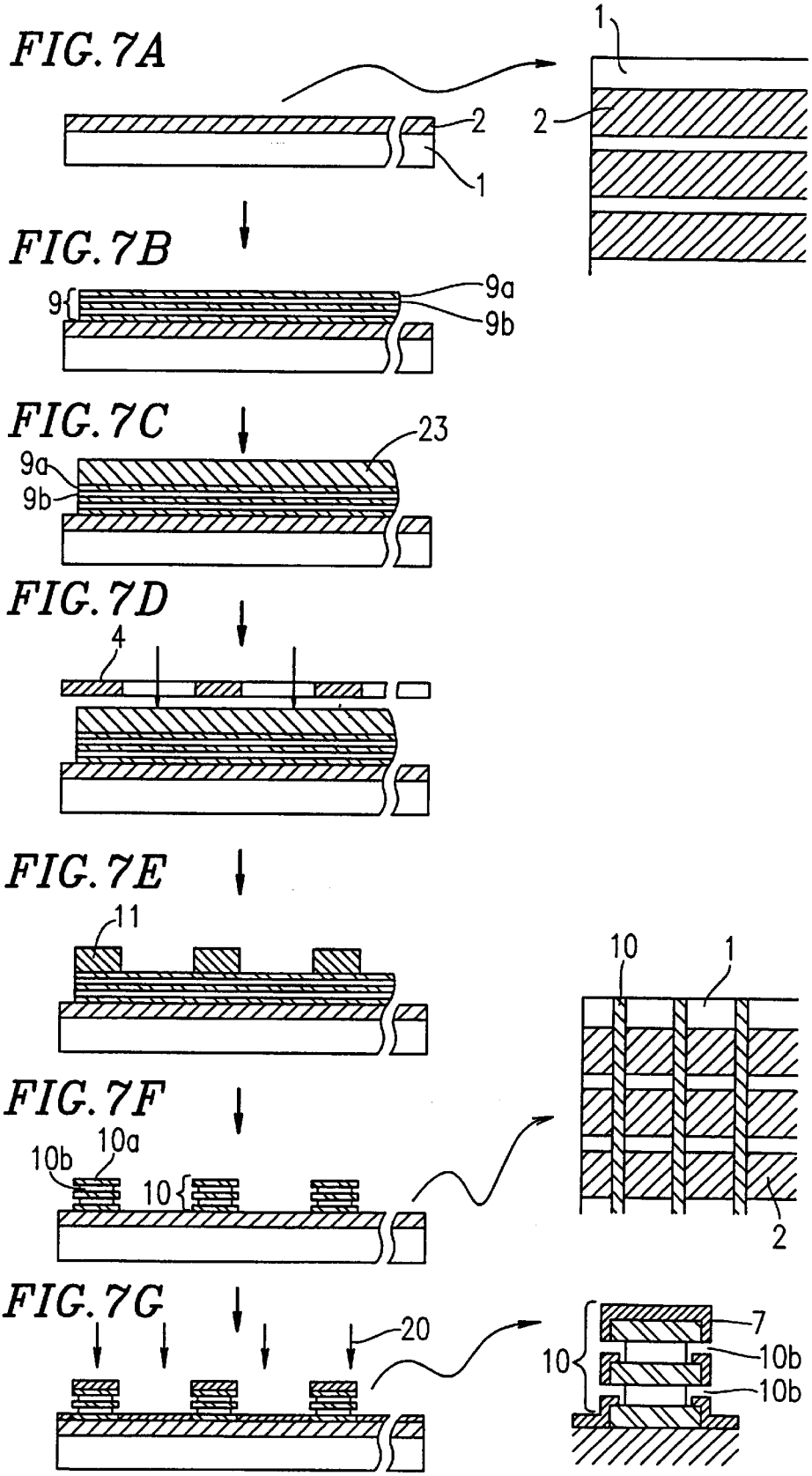

ELECTROLUMINESCENCE DISPLAY PANEL AND PRODUCTION METHOD OF THE SAME

BACKGROUND OF THE INVENTION

1. Field of the Invention:

The present invention relates to an electroluminescence display panel in which light-emitting elements utilizing the electroluminescence of an organic material are arranged in a matrix, and a method for producing the same.

2. Description of the Related Art:

An electroluminescence display panel in which an organic material for obtaining electroluminescence and metal electrodes (serving as upper electrodes) for transferring a current are subsequently deposited by a vacuum vapor deposition method on a glass substrate with patterned ITO (indium tin oxide) transparent electrodes (serving as lower electrodes) is known.

In such a display, light is emitted from the portions of the organic material which are interposed between the ITO electrodes and the metal electrodes. In the case where the ITO electrodes and the metal electrodes are both patterned into a stripe shape, and arranged so as to intersect each other (e.g., orthogonal to each other), an electroluminescence display panel capable of providing a dot-matrix display can be obtained.

For fabricating such a display panel, the metal electrodes are patterned by depositing a metal material on the substrate through a metal mask having desired opening patterns. However, patterning the metal electrodes using a metal mask has the following problems.

In the case of the metal mask for forming stripe patterns for providing image display, the metal mask has a large open area and a small mask portion. Such a metal mask thus has a poor mechanical strength. Therefore, the metal mask is likely to be bent and partially separated from the substrate surface.

When the metal mask is partially separated from the substrate surface and a gap is produced therebetween, a material being deposited is introduced into the gap, thereby causing defective patterns of the metal electrodes or the like. This leads to a serious problem particularly when small patterns are formed over a large area.

A method for forming a metal film to pattern metal electrodes by photolithography techniques is possible in order to solve the above-mentioned problem.

However, this method raises another problem as follows: the organic material may be damaged by a solvent of a resist solution, a developer and an etchant, or by plasma in the case of a dry etching method, whereby characteristics of the light-emitting elements (light-emitting portions) may be degraded.

Moreover, a method for producing an electroluminescence display panel by using a technique of obliquely supplying an upper electrode material onto a substrate having a plurality of stripe-shaped insulation films is described in Japanese Laid-open Publication No. 5-2058859. In this method, however, vapor of the metal electrode material may be undesirably directed to the sides of the insulation films, thereby hindering desirable patterning.

SUMMARY OF THE INVENTION

According to one aspect of the present invention, an electroluminescence display panel includes: a substrate; a plurality of stripe-shaped lower electrodes formed adjacent and spaced apart from each other on the substrate so as to extend in a first direction; a plurality of stripe-shaped insulation films formed spaced apart from each other on the stripe-shaped lower electrodes so as to extend in a second direction which crosses the first direction, each of the stripe-shaped insulation films having a groove extending in the second direction; a plurality of organic films for providing electroluminescence formed over the plurality of stripe-shaped lower electrodes and the plurality of stripe-shaped insulation films, the plurality of organic films being separated from each other by the grooves of the stripe-shaped insulation films; and an upper electrode being formed from an electrically conductive film and formed on the organic film.

In one example, a plurality of the grooves are formed in each of the stripe-shaped insulation films so as to extend in the second direction.

In one example, the stripe-shaped insulation films are formed from a water-resisting material.

In one example, the stripe-shaped insulation films are formed from a moisture-absorbing material.

In one example, the upper electrodes do not reach respective ends of the stripe-shaped insulation films, the ends of the stripe-shaped insulation films being located along the second direction.

According to another aspect of the present invention, an electroluminescence display panel includes: a substrate; a plurality of stripe-shaped lower electrodes formed spaced apart from each other on the substrate so as to extend in a first direction; a plurality of stripe-shaped insulation films formed spaced apart from each other on the stripe-shaped lower electrodes so as to extend in a second direction which is perpendicular to the first direction, at least one recess being formed in a side surface of each stripe-shaped insulation film; an organic film for providing electroluminescence, the organic film being formed at least on each lower electrode located between the stripe-shaped insulation films which are adjacent to each other, and the stripe-shaped insulation films, and the organic film being separated by the recess; and an upper electrode being formed from an electrically conductive film and formed on the organic film.

In one example, each of the stripe-shaped insulation films has a cross sectional width broadening toward its bottom, and a protruding portion is formed at a lowermost portion of each of the stripe-shaped insulation films.

In one example, each of the stripe-shaped insulation films includes alternate layers of insulation materials having different etching rates.

In one example, a first alternate layer is formed from a water-resisting material and a second alternate layer is formed from a moisture-absorbing material.

In one example, at least one groove is formed in a surface of each stripe-shaped insulation film.

In one example, the upper electrodes do not reach respective ends of the stripe-shaped insulation films, the ends of the stripe-shaped insulation films being located along the second direction.

In one example, the upper electrodes are formed after the stripe-shaped lower electrodes and the stripe-shaped insulation films are sequentially formed on the substrate, the upper electrodes being formed by supplying the electrically conductive material onto the substrate at a prescribed angle from an axis perpendicular to a surface of the substrate.

In one example, the groove is formed in a surface of each stripe-shaped insulation film by forming a groove in the surface of each stripe-shaped insulation film or by locating a pair of stripe-shaped insulation films close to each other.

In one example, the at least one recess is formed in a side surface of each stripe-shaped insulation film by etching.

In one example, at least the upper electrodes are formed by supplying the electrically conductive material from a direction substantially perpendicular to a surface of the substrate.

In one example, the stripe-shaped insulation films are formed by lifting off a resist formed before depositing the stripe-shaped insulation films.

Thus, the invention described herein makes possible the advantages of (1) providing an electroluminescence display panel capable of patterning upper electrodes without using a metal mask, thereby readily achieving smaller patterns and larger display area, as well as a method for producing the same; (2) providing an electroluminescence display panel capable of patterning the upper electrodes without using photolithography techniques after light-emitting portions are formed, thereby achieving improved reliability without damaging the light-emitting portions, as well as a method for producing the same; (3) providing an electroluminescence display panel having an insulation film with a simple structure, thereby achieving improved production efficiency of the insulation film, and reduction in cost, as well as a method for producing the same; (4) providing an electroluminescence display panel capable of improving uniformity of the deposited films, thereby reducing non-uniformity of the luminance, and improving the display quality, as well as a method for producing the same; (5) providing an electroluminescence display panel capable of improving durability of the light-emitting elements, thereby improving reliability, as well as a method for producing the same; and (6) providing an electroluminescence display panel being produced without using a special process, thereby achieving reduction in costs, as well as a method for producing the same.

Hereinafter, the functions of the present invention are described.

The electroluminescence display panel having the above-mentioned structures can be produced by depositing an electrically conductive material (upper electrode material) onto the substrate surface in the direction oblique or substantially oblique from a normal direction with respect to the substrate surface in the plane extending perpendicular to the line parallel to the grooves of the insulation films. In such a deposition step, vapor of the electrically conductive material is directed obliquely onto the substrate. Therefore, the vapor is blocked at least by one of the side surfaces of each groove. As a result, the conductive material is not undesirably deposited on the side surface(s) which blocks the vapor and a portion of the bottom of the groove which is located in the vicinity thereof. Similarly, the conductive material is not deposited on one of the side surfaces of each insulation film and a portion of the bottom of the groove which is located in the vicinity thereof.

It is now assumed that each of the grooves has a U-shaped cross section (although V-shaped and U-shaped cross sections are possible) and a depth D and the conductive material is directed to the substrate at an angle $\theta$ to the plane perpendicular to the substrate. In such a case, the conductive material is not deposited on one of the side surfaces of each groove and a portion of the bottom of the groove which extends from the side surface to the position away from the side surface by $D \times (\cos\theta)\sin\theta)$.

Thus, the upper electrodes are separated by the grooves and the insulation films. As a result, the upper electrodes are electrically insulated by the grooves and on one side of the insulation films, whereby independent electrodes can be obtained.

This means that the upper electrodes can be patterned without using a metal mask and/or photolithography techniques.

Accordingly, the undesirable effects of the above-mentioned problems resulting from the use of a metal mask can be solved or minimized by the present invention.

Moreover, since the lower electrodes, insulation films and grooves can be formed before the organic film is formed, patterning can be conducted by using photolithography techniques without damaging the light-emitting elements. As a result, the size of the light-emitting elements or patterns can be reduced to the limit of the photolithography technique.

Furthermore, the stripe-shaped lower electrodes and the stripe-shaped insulation films intersect each other, and a groove is formed on the surface of each insulation film so as to extend in the direction in which the insulation film extends. Therefore, the upper electrodes are electrically isolated on one side of the grooves. Thus, a matrix addressing display system using the intersecting, stripe-shaped upper and lower electrodes can be achieved.

For example, the stripe-shaped lower electrodes having a width H may be formed with a pitch P, and the stripe-shaped insulation films having a width (P-H) may be formed with a pitch P so as to intersect the lower electrodes. Thereafter, the organic film and the upper electrodes may be formed thereon. In such a case, a matrix display in which square, light-emitting portions each having an area of H×H are arranged in a matrix can be achieved.

Due to diffusion of the vapor of the conductive material, the conductive material may be undesirably deposited on such blocked portions of the grooves and insulation films as described above. Such deposition on the blocked portions can be prevented by increasing the thickness of the insulation films and obliquely depositing the conductive material.

A plurality of grooves may be formed in a surface of each insulation film so as to extend in the direction in which the insulation film extends. In this case, the number of portions for separating the upper electrodes is increased according to the number of the grooves, whereby the upper electrodes are more likely to be separated from each other. As a result, the reliability can be improved.

It is preferable to form the grooves in parallel so as not to intersect each other. When the grooves intersect each other, the total area of the portions for separating the upper electrodes is reduced due to the intersections of the grooves. As a result, by forming the grooves in parallel, the upper electrodes can be separated more efficiently.

In the case where the lower electrodes, the insulation films for separating the electrodes, the organic film and the upper electrodes are sequentially deposited in this order, the insulation films, the upper electrodes and the lower electrodes are exposed at the element surface. In this case, moisture and oxygen may enter the organic film through the respective interface between the organic film and its adjacent films (i.e., the upper electrodes and the insulation films). Since the upper electrodes generally intercept moisture and oxygen, moisture and oxygen may enter the organic film through the interface between the organic film and the insulation films.

The insulation films may be formed from a water-resisting material. In this case, moisture from the insulation films can be prevented from entering the organic film, whereby durability of the light-emitting elements can be improved.

The insulation films may alternatively be formed from a moisture-absorbing material. In this case, moisture entering the organic film through the interface between the organic film and the insulation films can be captured, whereby durability of the light-emitting elements can be improved. After the upper electrodes are formed, the water-resisting material may be deposited on the substrate so as to cover the light-emitting elements. In this case, moisture can be further prevented from entering the organic film through the interface between the organic film and the upper electrodes, whereby durability of the light-emitting elements can further be improved.

If the upper electrodes reach the ends of at least one of the grooves and the insulation films for isolating the upper electrodes, electrical conduction may occur at that portion of the upper electrodes. As a result, the upper electrodes cannot be electrically isolated on both sides of the insulation films. Therefore, the upper electrodes can be reliably separated from each other by forming the upper electrodes so as not to cover the ends of the insulation films and the grooves.

A recess(es) may be formed in at least one of the side surfaces of each insulation film. Thus, when the conductive material (upper electrode material) is deposited from a direction perpendicular to the substrate surface, the vapor of the conductive material is blocked by the protruding portions (i.e., the side walls of the recess) of the insulation film. Therefore, the conductive material is not undesirably deposited in the recess. Moreover, when the conductive material is deposited onto the substrate surface from the direction oblique or substantially oblique from a normal direction with respect to the substrate surface in the plane extending perpendicular to the line parallel to the grooves of the insulation films, the conductive material is not deposited on a rear surface of the protruding portion(s) located on one side of the insulation film. At this time, the conductive material may not be deposited on the entire protruding portion(s) located on the other side of the insulation film.

Accordingly, when the recess(es) is formed in at least one of the side surfaces of each insulation film, the upper electrodes can be readily isolated on the at least one side of the insulation films, regardless of the direction in which the electrically conductive material is deposited.

After the insulation films are formed, the organic film and the upper electrodes are formed, whereby electroluminescence is obtained. The organic film and the upper electrodes are also separated by the insulation films. At this time, the separated end portions of the upper electrodes may possibly be deposited on the portion other than the organic film. If the upper electrodes are located on, for example, the lower electrodes, a short-circuit occurs between the upper and lower electrodes. As a result, an electric field required for the organic film cannot be generated.

Accordingly, each insulation film may have a cross sectional width broadening toward its bottom so that the upper electrodes are not in contact with the lower electrodes even when the upper electrodes are deposited on a portion other than the organic film. Moreover, the lowermost layer of each insulation film may protrude with respect to the other portion of the insulation film. As a result, the respective separated ends of the organic film and upper electrodes are deposited on the protruding portion of the lowermost layer. Thus, even when the upper electrodes are located on a portion other than organic film, the upper electrodes can be reliably prevented from being in contact with the lower electrodes by the protruding portion of the lowermost layer.

The insulation film may include alternate layers of materials having different etching rates. This insulation film is formed by alternatingly depositing the material having different etching rates. In such a case, when the insulation film is patterned by photolithography techniques, a layer of the material having a higher etching rate is etched faster than a layer of the material having a lower etching rate, whereby a recess is formed in the insulation film due to the difference in etching rate. As a result, a recess can be formed in at least one side surface of each insulation film.

In the case where the insulation film is dry-etched isotopically, the stripe-shaped insulation films each having a cross sectional width broadening toward its bottom can be obtained.

Materials having a water resisting property and a moisture-absorbing property may be used as the insulation film materials having different etching rates. In this case, the water-resisting material prevents moisture from entering the organic film through the interface between the organic film and the lower electrodes. Moreover, the moisture-absorbing material absorbs moisture which is present within the light-emitting elements and at the interface between the organic film and the insulation films. Thus, the electroluminescence characteristics are less affected by moisture, whereby reliability of the light-emitting elements is improved.

According to the present invention, the stripe-shaped lower electrodes intersect the stripe-shaped insulation films, and the recess(es) may be formed in at least one side surface of each insulation film. Therefore, the upper electrodes can be electrically insulated on the at least one side of the insulation films. As a result, matrix driving using the intersecting, stripe-shaped upper and lower electrodes can be achieved.

These and other advantages of the present invention will become apparent to those skilled in the art upon reading and understanding the following detailed description with reference to the accompanying figures.

BRIEF DESCRIPTION OF THE DRAWINGS

FIGS. 1A to 1E are diagram illustrating a production process of an electroluminescence display panel according to Example 1 of the present invention;

FIGS. 5A to 5G are diagrams illustrating a production process of an electroluminescence display panel according to Example 3 of the present invention;

FIGS. 7A to 7G are diagrams illustrating a production process of an electroluminescence display panel according to Example 4 of the present invention;

DESCRIPTION OF THE PREFERRED EMBODIMENTS

Figure 2:
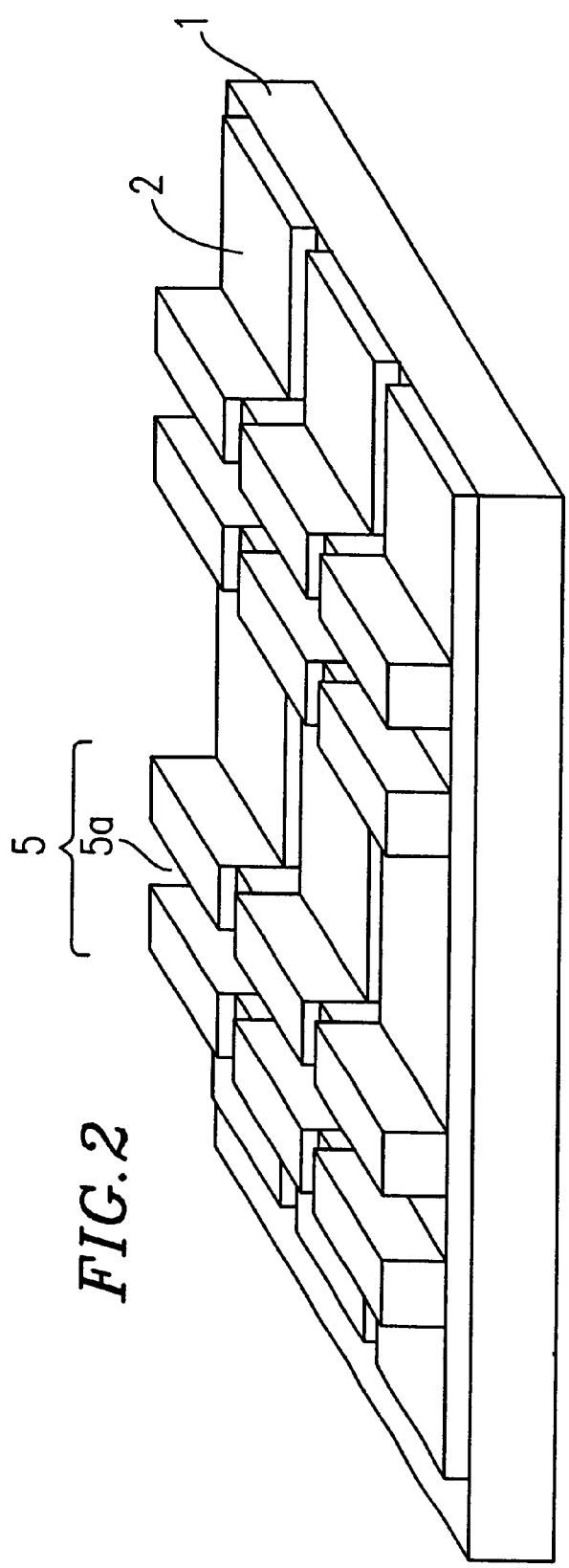
FIG. 2 is a perspective view of FIG. 1D, wherein insulation films each having a groove are formed.

Hereinafter, the present invention is specifically described by way of illustrative examples with reference to the accompanying drawings.

EXAMPLE 1

An electroluminescence display panel according to Example 1 of the present invention is now described with reference to FIGS. 1A to 1E, 2 and 3A to 3C. In Example 1, stripe-shaped ITO films 2 each serving as a lower electrode are formed on a glass substrate 1, and stripe-shaped insulation films 5 are formed thereon, as shown in a cross sectional view and partial enlarged view thereof in FIG. 1E. The stripe-shaped insulation films 5 extend in the direction perpendicular to the direction in which the stripe-shaped ITO films 2 extend. Each stripe-shaped insulation film 5 has a groove 5a reaching the stripe-shaped ITO patterns 2.

Moreover, an organic film 6 having a two-layer structure of a lower organic film 6a and an upper organic film 6b is formed on the portions of each stripe-shaped ITO film 2 which are located between adjacent stripe-shaped insulation films 5 and 5. An upper electrode 7 is formed on each upper organic film 6b.

The lower organic film 6a, the upper organic film 6b and the upper electrode 7 are also formed on each stripe-shaped insulation film 5 and in a portion of each groove 5a, as shown in the enlarged view of FIG. 1E.

The electroluminescence display panel having such a structure is produced by the process shown in FIGS. 1A to 1E. Hereinafter, this electroluminescence display panel is specifically described along with a production process thereof.

First, as shown in FIG. 1A, a 50×50 mm glass substrate 1 having an ITO film thereon (the substrate made by Matsunami Glass Kabushiki Kaisha) is etched by well-known photolithography techniques, whereby the stripe-shaped ITO films 2 having a line width of about 300 μm are formed with a pitch of about 330 μm. It should be noted that the number of stripe-shaped ITO films is 64 in the present example.

Then, the glass substrate 1 is placed onto a spinner (Model No. 1H-DZ made by MIKASA Kabushiki Kaisha), and a photosensitive resist 3 having an insulation property is applied to the glass substrate 1 as shown in FIG. 1B. This photosensitive resist 3 serves as an insulation film. At this time, the viscosity of the applied material and the rotational speed of the spinner are adjusted so that the photosensitive resist 3 is applied with a thickness of about 2 μm. It should be noted that photosensitive polyimide may also be used as an insulation material.

Thereafter, as shown in FIG. 1C, exposure, development and baking steps are conducted using a metal mask 4, whereby the stripe-shaped insulation films 5 are formed so as to extend in the direction perpendicular to the direction in which the stripe-shaped ITO films 2 extend (see FIG. 1D).

The exposure and development steps are conducted so that the stripe-shaped insulation films 5 each having a width of about 30 μm are formed with a pitch of about 330 μm and so that a groove 5a having a width of about 5 μm is formed in the center of each stripe-shaped insulation film 5. The number of stripe-shaped insulation films 5 is 65.

As shown in FIG. 2 (corresponding to a perspective view of FIG. 1D), due to the presence of the ITO films (i.e., the lower electrodes 2) with a thickness of about 200 μm, each insulation film 5 for separating the upper electrodes 7 has a difference in height between the portion formed on the ITO films 2 and the portion formed on the glass substrate 1. However, this difference in height does not adversely affect the separation of the upper electrodes 7.

Thereafter, the glass substrate 1 having the stripe-shaped ITO films 2 and the stripe-shaped insulation films 5 is placed in a substrate holder of a resistance heating vacuum vapor deposition apparatus (Model No. EX-400 by ULVAC Inc.). Moreover, an organic material is placed in a Mo boat for sublimation material (the boat made by Nihon Backs Metal Kabushiki Kaisya), and an electrode material is placed in a Mo boat (made by Nihon Backs Metal Kabushiki Kaisya). Then, the resistance heating vacuum vapor deposition apparatus is evacuated.

In order for the organic film 6 to have a two-layer structure of the lower organic film (hole transporting layer) 6a and the upper organic film (light-emitting layer) 6b, two kinds of organic materials, that is, TPD (N, N'-diphenyl-N, N'-his (3-methyl phenyl)-1, 1'-biphenyl-4, 4'-diamine) and Alq$_3$ (Tris (8-hydroxyquinoline) aluminum), are placed as a deposition source. TPD is used as a hole transporting material, whereas Alq$_3$ is used as a light-emitting material. An AlLi alloy is used as the electrode material.

When the degree of vacuum in the resistance heating vacuum vapor deposition apparatus reaches the order of $10^{-6}$ Torr, TPD (hole transporting material) is first heated, whereby the TPD film is deposited with a thickness of about 50 nm at a deposition rate of about 0.1 to about 0.2 nm/sec. Then, Alq$_3$ (light-emitting material) is heated, whereby the Alq$_3$ film is deposited with a thickness of about 50 nm at a deposition rate of about 0.1 to about 0.2 nm/sec. It should be noted that the film thickness and deposition rate of TPD and Alq$_3$ are monitored by a crystal oscillator thickness meter (a crystal monitor) (Model No. CRTM-5000 made by ULVAC Inc.).

Thereafter, the AlLi alloy (deposition source) which serves as the upper electrodes 7 is heated, whereby the AlLi film is deposited with a thickness of about 150 nm at a deposition rate of about 1 nm/sec. Upon conducting these deposition steps, the glass substrate 1 is placed obliquely with respect to the deposition source so that the glass substrate 1 is placed at an angle of about 20 degrees or more from the horizontal plane in the plane extending perpendicular to the line parallel to the grooves 5a. In other words, the glass substrate 1 is placed such that an angle θ of the substrate surface with the direction in which the vapor of the deposition material is directed from the deposition source onto the substrate surface is in the range from about 20 degrees to less than about 90 degrees.

As a result, as shown in FIG. 1E, vapor of the organic materials and upper-electrode material is directed onto the glass substrate 1 at an angle θ of about 20 degrees or more from the axis which is perpendicular to the substrate surface. In this example, it should be noted that the distance between the deposition source and the glass substrate 1 is set to about 200 mm.

Through these deposition steps, the deposition materials are adhered to the top surface and one of the side surfaces of each insulation film 5, as shown in the partial enlarged view of FIG. 1E. It should be noted that this partial enlarged view shows how the organic film 6 and the AlLi film 7 are deposited. As described above, the organic film 6 has a two-layer structure of the TPD film 6a and the Alq$_3$ film 6b.

9

Figure 3A:
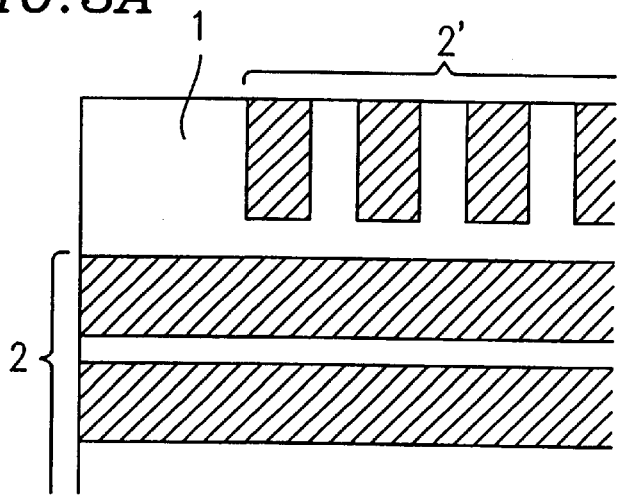
FIGS. 3A to 3C are plan views illustrating the production process of the electroluminescence display panel of Example 1.
Figure 3B:
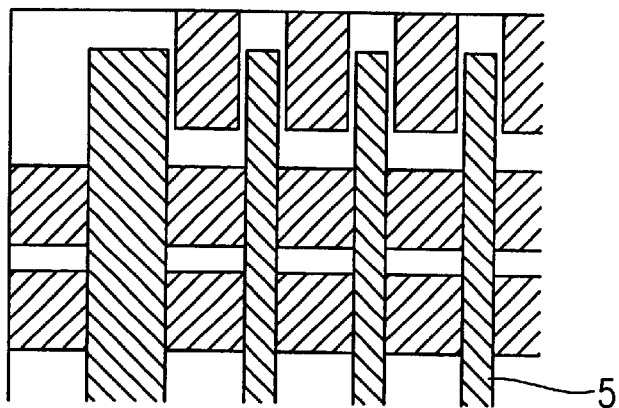
Figure 3C:
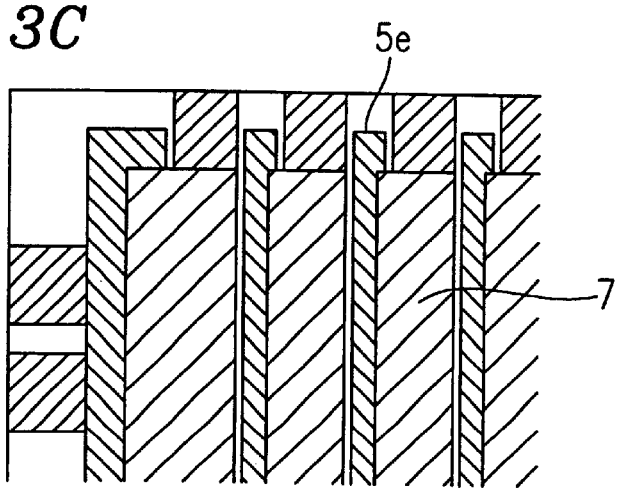

As shown in FIG. 3C, using a metal mask (not shown) placed on the glass substrate 1, AlLi serving as the upper electrodes 7 is deposited such that the AlLi film does not reach the ends 5e of the grooves (not shown) (i.e., the ends in the extending direction of the grooves (not shown)) in the insulation films 5 formed on the glass substrate as shown in FIG. 3B. Moreover, the upper electrodes 7 separated at the insulation films 5 are electrically connected to respective electrodes 2' which have been formed on the glass substrate 1 as terminal electrodes, as shown in FIG. 3A.

The electrodes 2' may be transparent electrodes such as ITO, or may be metal electrodes such as at least one of Al, Ag, Au or Cu. Alternatively, the electrodes 2' may be electrodes of an alloy or compound. It is preferable to form the electrodes 2' from ITO in terms of production efficiency, because the electrodes 2' and the lower electrodes 2 can be formed simultaneously in the same step.

By providing the insulation films 5 and the grooves 5a, the stripe-shaped upper electrodes 7 formed as described above are electrically isolated at one of the side surfaces of each insulation film 5 and at one side of each groove 5a. Accordingly, 64 independent upper electrodes 7 which are interposed between 65 insulation films 5 are obtained. Each upper electrode 7 has a width of about 300 μm.

Regarding the electroluminescence display panel of Example 1 thus produced, the following was confirmed: in the case where a voltage of 10 V is applied across the organic film 6 using the ITO lower electrodes 2 as positive electrodes and the AlLi upper electrodes 7 as negative electrodes, green light with a luminance of about 500 cd/m$^2$ is emitted from the portion having a laminated structure of substrate/ITO/TPD/Alq$_3$/AlLi; that is, from the portion where the ITO lower electrode 2 and the upper electrode 7 spatially overlap each other without the insulation film interposed therebetween.

The other portions have a laminated structure of substrate/TPD/Alq$_3$/AlLi, substrate/ITO/insulation film/TPD/Alq$_3$/AlLi or substrate/insulation film/TPD/Alq$_3$/AlLi. In other words, the other portions do not include either the lower electrode 2 or the upper electrode 7, or otherwise include the insulation film 5. Therefore, light is not emitted or is prevented from being emitted from these portions.

Moreover, the laminated structure of substrate/ITO/TPD/Alq$_3$/AlLi is present in a portion of each groove 5a in the insulation films 5; that is, in a portion where AlLi reaches the bottom of the groove 5a. As described above, light is generally emitted from the laminated structure of substrate/ITO/TPD/Alq$_3$/AlLi upon application of 10 V voltage. However, the AlLi deposited within the groove 5a is electrically isolated from its adjacent upper electrode 7. Therefore, light is not emitted from this portion unless a voltage is applied thereto.

Thus, according to the electroluminescence display panel of Example 1, the stripe-shaped ITO films having a width of about 300 μm and the stripe-shaped AlLi films having a width of about 300 ∞m intersect each other. In other words, the stripe-shaped lower electrodes and the stripe-shaped upper electrodes 7 intersect each other. Consequently, a 64×64 dot-matrix electroluminescence display panel in which the minimum light-emitting regions of about 300×300 μm are arranged in a matrix with a pitch of about 330 μm can be obtained.

When this electroluminescence display panel is operated at a frame frequency of about 150 Hz by a well-known dynamic addressing method using the ITO lower electrodes 2 as data lines and the AlLi upper electrodes 7 as scanning lines, 64×64-dot character display can be obtained.

10

EXAMPLE 2

Hereinafter, an electroluminescence display panel according to Example 2 of the present invention is described. The electroluminescence display panel of Example 2 has a structure similar to that of Example 1. However, the production process of Example 2 is different from that of Example 1 as follows. It should be noted that the portions corresponding to those of Example 1 are denoted by the same reference numerals and characters as those in Example 1.

Figure 4A:
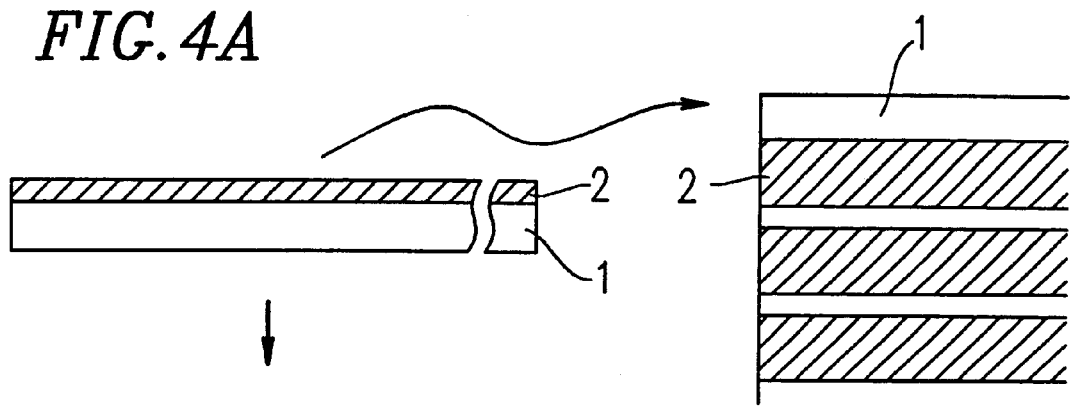
FIGS. 4A to 4D are diagrams illustrating a production process of an electroluminescence display panel according to Example 2 of the present invention.

First, by the step shown in FIG. 4A, stripe-shaped ITO films 2 having a line width of about 300 μm are formed on a glass substrate 1 with a pitch of about 330 μm.

Then, the resultant glass substrate 1 is placed onto a spinner which is similar to that used in Example 1, whereby a resist is applied thereto. At this time, the viscosity of the applied material and the rotational speed of a spin-coating apparatus are adjusted such that the resist is applied with a thickness of about 1 μm or less.

Figure 4B:
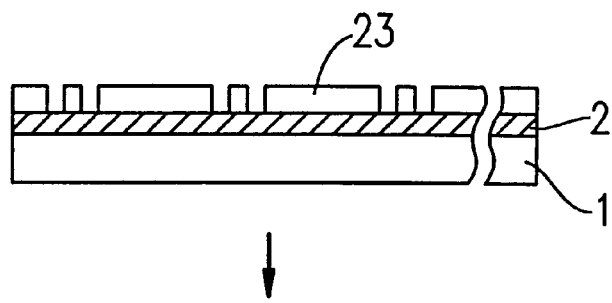

Thereafter, exposure and development steps are conducted, whereby stripe-shaped resist patterns 23 are formed so as to intersect the stripe-shaped ITO films 2, as shown in FIG. 4B. The exposure step is conducted so that the stripe-shaped resist patterns having a width of about 300 μm are formed with a pitch of about 330 μm and that another stripe-shaped resist pattern having a width of about 5 μm is left in the middle of every adjacent two resist patterns.

The baking step in order for the resist patterns to have an increased adhesion property is not conducted, whereby lift-off in the later process is facilitated.

Then, in order to form an insulation film, the glass substrate 1 having the resist patterns 23 thereon is placed in the substrate holder of the resistance heating vacuum vapor deposition apparatus, which is the same as that used in Example 1, and the resistance heating vacuum vapor deposition apparatus is evacuated with polyvinyl alcohol (hereinafter, referred to as PVA) being placed in the Mo boat.

Figure 4C:
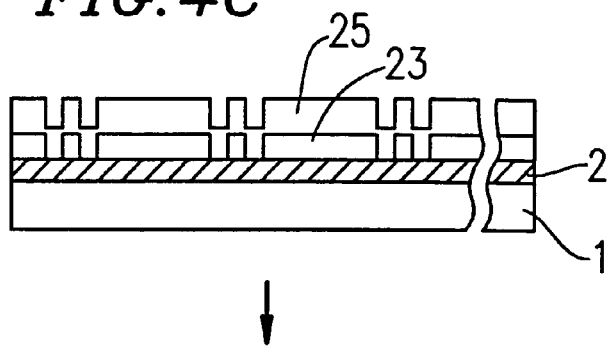

When the degree of vacuum in the resistance heating vacuum vapor deposition apparatus reaches the order of 10$^{-6}$ Torr, PVA is heated, whereby the PVA film 25 is deposited with a thickness of about 1 to about 2 μm at a deposition rate of about 1 to about 2 nm/sec (see FIG. 4C).

Then, the glass substrate 1 is removed from the resistance heating vacuum vapor deposition apparatus, and is subjected to ultrasonic cleaning in acetone for 30 minutes.

Figure 4D:
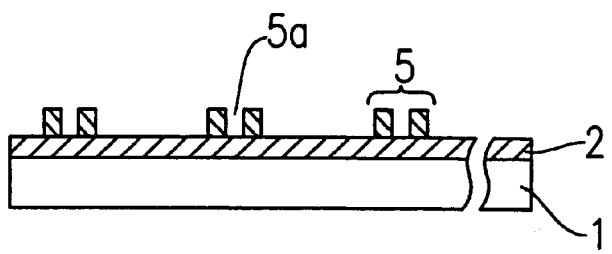

During the ultrasonic cleaning, the glass substrate 1 is lifted off at the resist patterns 23 formed before the PVA film 25 is deposited, that is, the resist patterns 23 are removed from the glass substrate 1, whereby the PVA film 25 formed on the resist patterns 23 is also removed simultaneously. As a result, the PVA patterns (insulation films 5) having a width of about 30 μm are formed with a pitch of about 330 μm, and a groove 5a having a width of about 5 μm is formed in the center of each PVA pattern (see FIG. 4D).

Thereafter, an organic film 6 upper electrodes 7 are formed by the deposition steps similar to those of Example 1 as shown in FIG. 1E, whereby an electroluminescence display panel having a structure similar to that of Example 1 is produced.

In Example 2, PVA is used as a material of the insulation films 5. However, a similar insulation film can be obtained by depositing or applying other high-molecular materials such as polyimide, nylon or polyurea.

A similar insulation film can also be obtained by forming a film of an inorganic material such as SiO$_2$, SiN or AlN$_x$ by a vacuum vapor deposition method or sputtering method.

Moreover, acetone is used as a solvent for facilitating lift-off in Example 2. However, ultrasonic cleaning may alternatively be conducted using methyl acetate, methyl ethyl ketone or the like.

EXAMPLE 3

Figure 6:
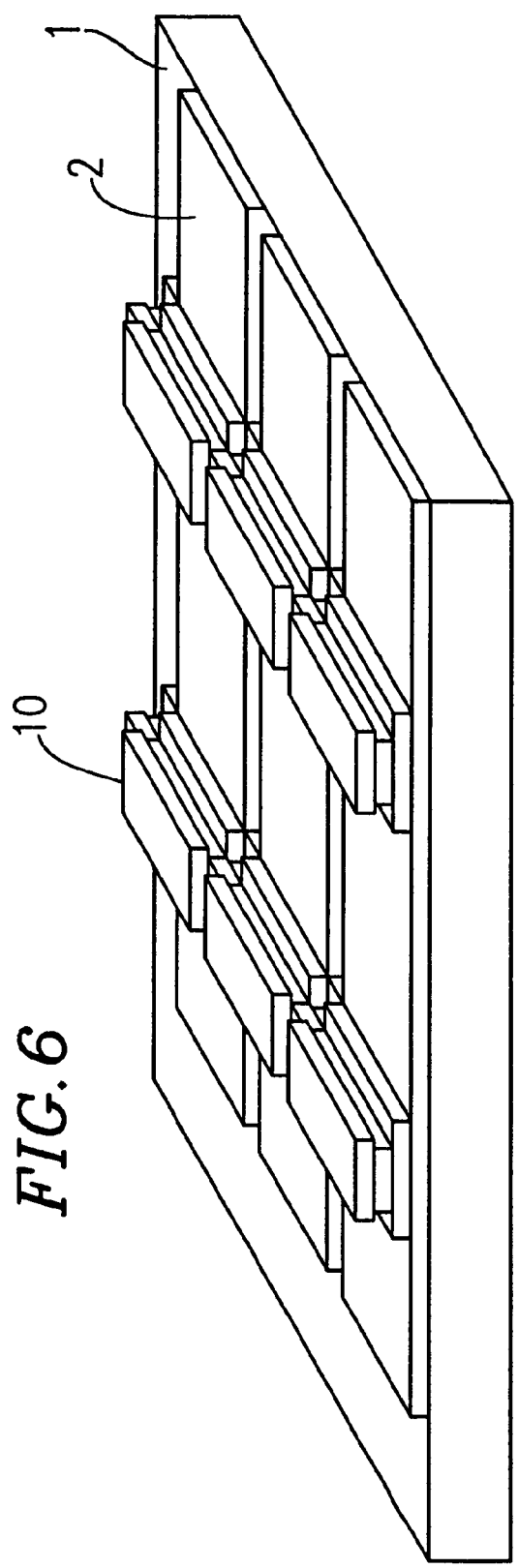
FIG. 6 is a perspective view of FIG. 5F, wherein insulation films each having a recess on both sides thereof are formed.

Hereinafter, an electroluminescence display panel according to Example 3 of the present invention is described with reference to FIGS. 5A to 5G and 6. The electroluminescence display panel of Example 3 is different from that of Example 1 in the structure of insulation films 10. In Example 3, as shown in FIGS. 5F and 6, each stripe-shaped insulation film 10 has a recess (or side groove) 10b on both sides thereof. More specifically, each insulation film 10 is shaped such that the central portion 10b in the vertical direction has a smaller width than the upper and lower portions 10a, whereby the recesses 10b are provided. Upper electrodes 12 are separated by such insulation films 10 having the recesses 10b. Example 3 is different from Examples 1 and 2 in this point. Hereinafter, the production process of Example 3 is described with reference to FIGS. 5A to 5G.

First, by the steps similar to those of Example 1, stripe-shaped ITO films 2 having a width of about 300 $\mu$m are formed on a glass substrate 1 with a pitch of about 330 $\mu$m, as shown in FIG. 5A.

Then, as shown in FIGS. 5B to 5D, a photosensitive resist 23 for lift-off is applied on the glass substrate 1 and patterned, whereby stripe-shaped resist patterns 8 having a width of about 300 $\mu$m are formed with a pitch of about 330 $\mu$m.

Thereafter, an insulation film 9 is formed thereon, As shown in FIG. 5E, the insulation film 9 has an alternate layers of materials 9a and 9b, wherein the material 9a has a relatively low etching rate and the material 9b has a relatively high etching rate under the etching conditions of the subsequent etching step. More specifically, the insulation film 9 is formed by sequentially depositing the material 9a, the material 9b and the material 9a in this order.

In Example 3, polyimide is used as the material 9a having a relatively low etching rate, whereas PVA is used as the material 9b having a relatively high etching rate. Polyimide and PVA are both applied by a spin-coating apparatus. Moreover, the viscosity of the applied materials and the rotational speed of the spin-coating apparatus are adjusted so that each of the polyimide film and the PVA film are formed with a thickness of about 1 $\mu$m.

Then, the glass substrate 1 is lifted off at the resist patterns 8 in acetone. Thus, the stripe-shaped insulation films 10 for isolating the upper electrodes 12 are left. Furthermore, dry etching is conducted under an oxygen plasma until the recess 10b is formed on both sides of each insulation film 10 due to the difference in etching rate between polyimide and PVA.

As a result, the stripe-shaped insulation films 10 having a width of about 30 $\mu$m are formed with a pitch of about 330 $\mu$m, as well as the recess 10b having a width of about 1 $\mu$m and a depth of about 0.5 $\mu$m is formed on both sides of each insulation film 10 (see FIGS. 5F and 6). It should be noted that the number of stripe-shaped insulation films 10 is 65 in Example 3.

Thereafter, by using a vapor deposition method, an organic film (not shown) and the upper electrodes 12 are formed on the glass substrate 1 having the stripe-shaped ITO films 2 (which serve as the lower electrodes) and the stripe-shaped insulation films 10, as shown in FIG. 5G. In Example 3, the organic film and the upper electrodes 12 are formed by directing the vapor 20 of an organic material and an upper electrode material onto the glass substrate 1 from the direction which is substantially perpendicular to the glass substrate 1, as shown in FIG. 5G. Example 3 is different from Examples 1 and 2 in this point. Moreover, in order to improve the uniformity of the deposited films, deposition is conducted with the glass substrate 1 being rotated. It should be noted that the constitution of the deposition films and the deposition conditions are the same as those in Example 1.

In such a process, the organic material and upper electrode material are not deposited in the recesses 10b on both sides of the insulation films 10. Therefore, the upper electrode material is separated by the recesses 10b, whereby the upper electrodes 12 located between every adjacent two insulation films 10 and the upper electrodes 12 located on the insulation films 10 are obtained. Moreover, even when the vapor 20 is directed obliquely to the substrate 1 due to diffusion of the vapor 20 and/or the misalignment of the substrate 1 and the deposition source, the material is not entirely deposited on the surface of each recess 10b. More specifically, even when vapor of the material is directed obliquely to the substrate, as shown in FIG. 1E, the material is not deposited on a portion of a rear surface of the upper protruding portion 10a (i.e., upper side surface of the recess 10b). In this way, 64 independent electrodes having a width of about 300 $\mu$m which are interposed between 65 insulation films 10 are obtained.

Thus, according to Example 3, the ITO films having a width of about 300 $\mu$m and the AlLi films having a width of about 300 $\mu$m intersect each other. Consequently, a 64×64 dot-matrix electroluminescence display panel in which the minimum light-emitting regions of about 300×300 $\mu$m are arranged in a matrix with a pitch of about 330 $\mu$m is obtained.

This electroluminescence display panel is operated at a frame frequency of about 150 Hz by a well-known dynamic addressing method using the ITO lower electrodes 2 as data lines and the AlLi upper electrodes 12 as scanning lines, whereby 64×64 dot character display is obtained.

According to Example 3, the following specific effects can be obtained. PVA has a moisture absorbing property, whereas polyimide has a water resisting property. Therefore, moisture from the insulation films 10 is prevented from entering the organic material by the layers 10a of the insulation films 10, as well as moisture adhered to the glass substrate 1 is captured by the recesses 10b of the insulation films 10. Thus, moisture can be prevented from penetrating the organic material for a long time. Accordingly, durability of the light-emitting elements is improved, whereby the electroluminescence display panel having improved reliability can be obtained.

EXAMPLE 4

Hereinafter, an electroluminescence display panel according to Example 4 of the present invention is described with reference to FIG. 7A to 7G. According to Example 4, each insulation film 10 has a five-layer structure, as shown in FIG. 7G. Two recesses 10b which are similar to those of Example 3 are formed on both sides of each insulation film 10, wherein the two recesses 10b are located in upper and lower portions of each insulation film 10. Example 4 is different from Example 3 in this point. Hereinafter, the structure of the electroluminescence display panel is described along with a production process thereof with reference to FIGS. 7A to 7E.

It should be noted that the production process of Example 4 is the same as that of Example 1 until the stripe-shaped ITO films 2 having a line width of about 300 µm is formed on a glass substrate 1 with a pitch of about 330 µm (see FIG. 7A).

After the stripe-shaped ITO films 2 are formed on the glass substrate 1, an insulation film 9 is formed thereon. As shown in FIG. 7B, this insulation film 9 has an alternate layers of materials 9a and 9b, wherein the material 9a has a relatively low etching rate and the material 9b has a relatively high etching rate under the etching conditions in the subsequent etching step. More specifically, the insulation film 9 is formed by sequentially depositing the material 9a, the material 9b, the material 9a, the material 9b and the material 9a in this order.

In Example 4, $SiO_2$ is used as the material 9a having a relatively low etching rate, whereas Si is used as the material 9b having a relatively high etching rate. $SiO_2$ and Si are both deposited by using a well-known sputtering method. Each of the $SiO_2$ film and Si film are formed with a thickness of about 500 nm.

Then, as shown in FIG. 7C, a photosensitive resist 23 is applied on the insulation film 9. Thereafter, the resist 23 is patterned by exposure and development steps using a mask 4 (see FIG. 7D), whereby stripe-shaped resist patterns 11 having a width of about 300 µm are formed with a pitch of about 330 µm (see FIG. 7E).

Thereafter, dry etching is conducted using a $CF_4$ gas, whereby stripe-shaped insulation films 10 having a five-layer structure for separating the electrodes are formed. The dry etching is conducted at a $CF_4$ gas flow rate of about 25 cc/min., a $CF_4$ gas pressure of about 5 Torr, and a RF (radio frequency) power of about 200 W. Under such dry-etching conditions, Si is etched faster than $SiO_2$. As a result, the insulation films 10 having the upper and lower recesses 10b and 10b on both sides are left corresponding to the resist pattern 11 (see FIG. 7F).

Thereafter, the steps of depositing organic material and upper electrode material are conducted in a manner similar to that of Example 3. Thus, the electroluminescence display panel of Example 4 is produced (see FIG. 7G).

Figure 8A:
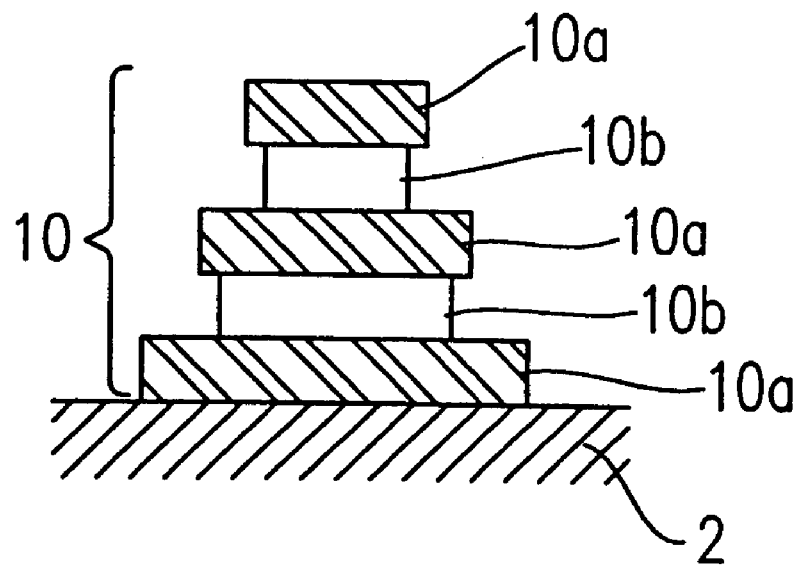
FIGS. 8A and 8B are cross sectional views of an insulation film.
Figure 8B:
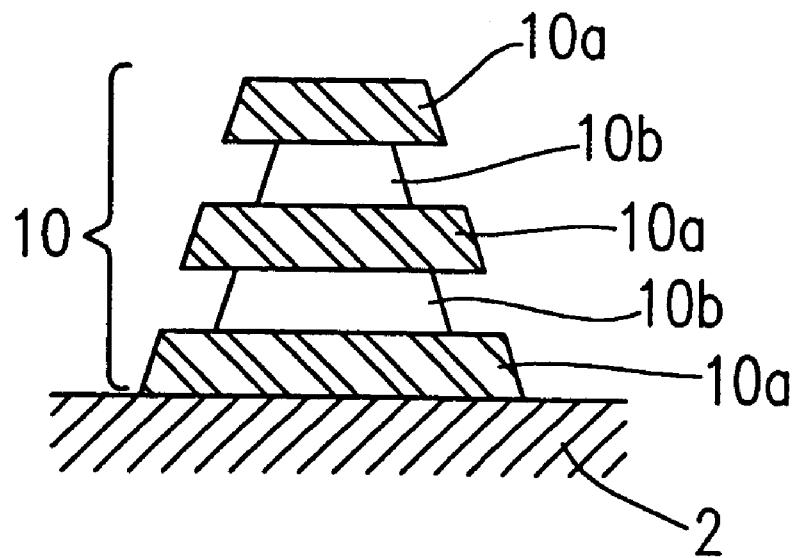

In the case where the insulation film 10 is dry-etched substantially isotopically, the stripe-shaped insulation films 10 each having a cross sectional width broadening toward its bottom (e.g., the cross sections as shown in FIGS. 8A and 8B) can be obtained.

Figure 9:
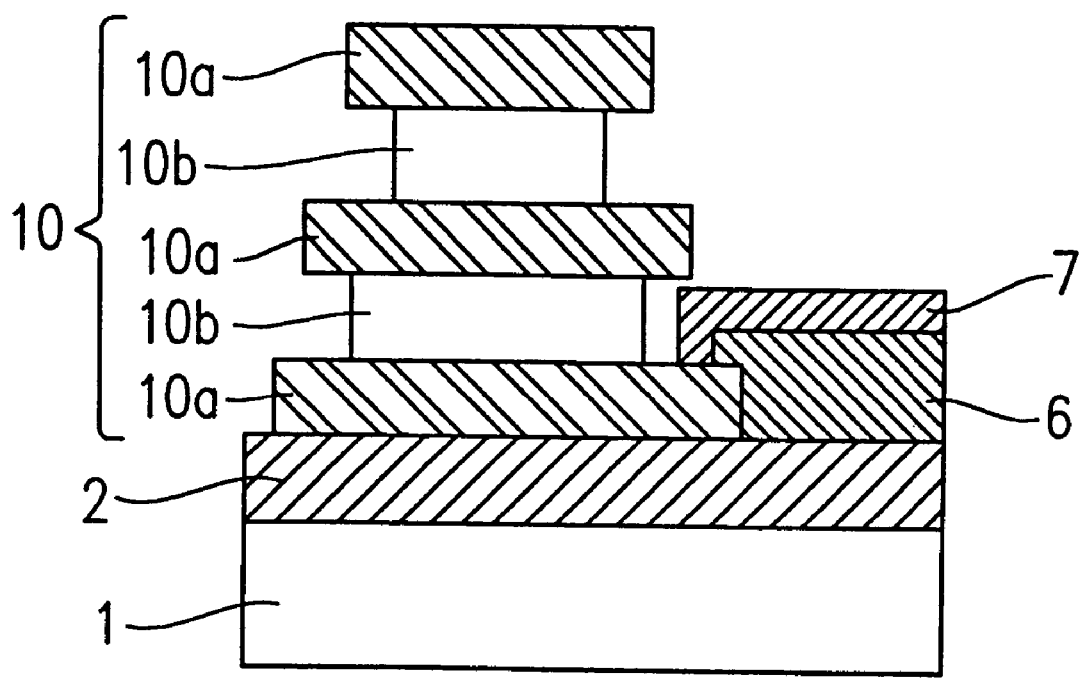
FIG. 9 is a diagram illustrating an effect of the structure of the insulation film according to the electroluminescence display panel of Example 4.

At this time, the stripe-shaped ITO lower electrode 2 and the AlLi upper electrode 7 are prevented from being in contact with each other by the protruding portion 10a of the lowermost layer of the insulation film 10, as shown in FIG. 9. Therefore, short-circuit between the upper and lower electrodes resulting from the contact therebetween can be reliably prevented.

EXAMPLE 5

Figure 10:
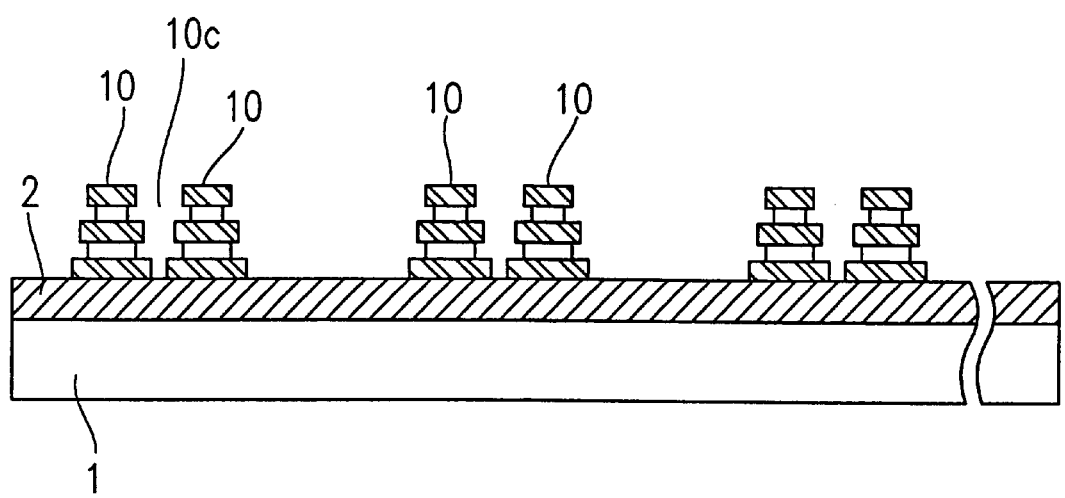
FIG. 10 is a cross sectional view of an electroluminescence display panel according to Example 5 of the present invention.

FIG. 10 shows an electroluminescence display panel according to Example 5 of the present invention. The electroluminescence display panel of Example 5 is a combination of Examples 1 and 4. More specifically, in Example 5, upper and lower recesses 10b and 10b are formed on both sides of each insulation film 10 as in Example 4, as well as a groove 10c is formed in the center of each insulation film 10 as in Example 1. As a result, the number of portions for electrically isolating the upper electrodes is increased, thereby further improving the yield.

The insulation film 10 having such a structure can be readily obtained by changing the shape of the resist patterns in the production steps shown in FIGS. 7D and 7E. More specifically, the resist is patterned such that each stripe-shaped resist pattern 11 includes two stripe-shaped resist patterns which are spaced apart from each other. The other production steps may be conducted as shown in FIGS. 7A to 7G.

COMPARATIVE EXAMPLE

A technique of separating the upper electrodes by forming a recess in a side surface of an insulation film is described in Japanese Laid-open Publication No. 8-315981. However, as described below, the technique described therein is clearly different from Example 4, and prevention of the short-circuit between the upper and lower electrodes, which is a specific beneficial effect of the present invention, cannot be achieved by this technique.

Figure 11A:
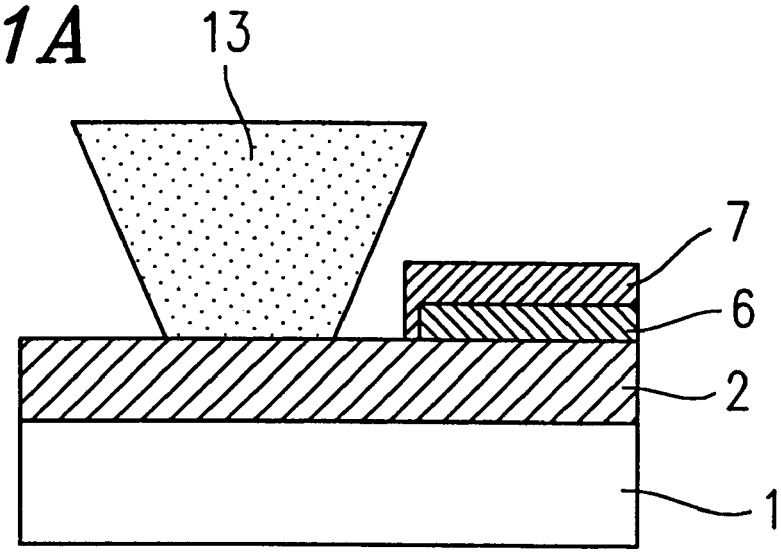
FIGS. 11A and 11B are cross sectional views of an electroluminescence display panel described in Japanese Laid-open Publication No. 8-315981.
Figure 11B:
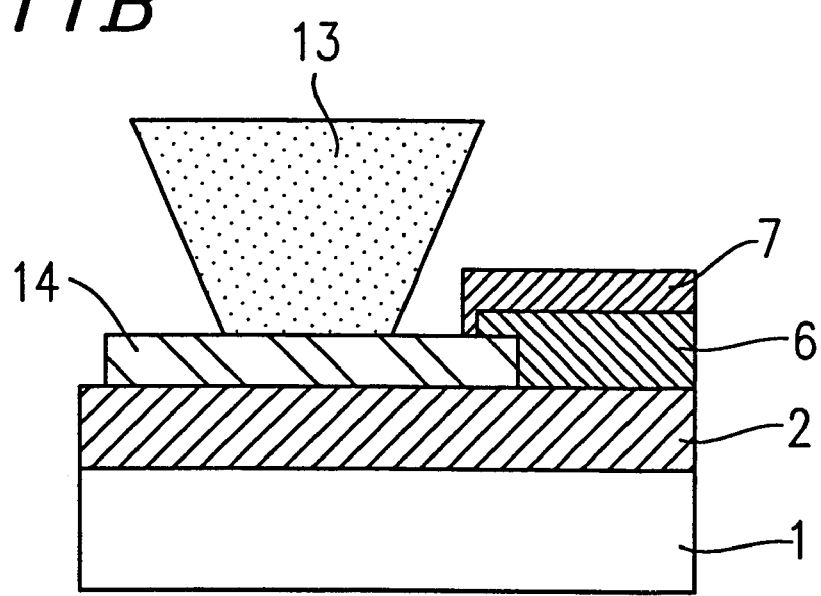

Hereinafter, the technique disclosed in Japanese Laid-open Publication No. 8-315981 is described as a comparative example with reference to FIGS. 11A and 11B. As shown in FIGS. 11A and 11B, in the electroluminescence display panel of the comparative example, each insulation film 13 has a cross sectional width narrowing toward its bottom, thereby separating the upper electrodes in the transverse direction of the figure.

With such an insulation film 13, however, the upper electrode 7 may be in contact with the lower electrode 2 at the portion where the organic film 6 and the upper electrode 7 are separated by the insulation film 13, as shown in FIG. 11A. As a result, a necessary electric field cannot be obtained between the lower electrode 2 and the upper electrode 7, whereby carriers are not implanted into the organic film 6, and electroluminescence cannot be obtained.

Then, Japanese Laid-open Publication No. 8-315981 addresses the above-mentioned problem by forming another insulation film 14 prior to forming the insulation film 13 for separating the electrodes.

In such a case, however, the insulation films 13 and 14 must be formed by the separate steps. Moreover, it is necessary to accurately align the insulation film 13 with respect to the insulation film 14. Therefore, the production efficiency is reduced.

Furthermore, a short-circuit between the upper and lower electrodes may occur due to misalignment of the insulation films 13 and 14, whereby the reliability is reduced.

By using the structure of the insulation films according to the present invention, short-circuits between the upper and lower electrodes can be reliably prevented without forming such an insulation film 14. Therefore, such reduction in production efficiency and reliability does not occur.

OTHER EXAMPLES

Although only one groove is formed in the surface of each insulation film in the above-mentioned examples, the present invention is not limited to this. For example, a plurality of grooves may be formed in parallel.

Furthermore, although one or two recesses are formed on both sides of each insulation film in the present invention, three or more recesses may alternatively be formed. The recess(es) may be formed only on one side of each insulation film.

According to the electroluminescence display panel of the present invention, a groove is formed in each insulation film so as to extend in the direction in which the insulation film extends, and the upper electrodes are separated by the grooves. Therefore, the upper electrodes are electrically isolated on both sides of the grooves, resulting in independent upper electrodes. Thus, the upper electrodes can be patterned without using a metal mask and photolithography techniques. As a result, the above-mentioned problems of the conventional example can be minimized or eliminated.

Moreover, since the lower electrodes, insulation films and grooves can be formed before the organic film is formed, patterning can be conducted by using photolithography techniques without damaging the light-emitting elements. As a result, the size of light-emitting elements or patterns can be reduced to the limit of the photolithography techniques.

Furthermore, the stripe-shaped lower electrodes and the stripe-shaped insulation films intersect each other, and a groove is formed on the surface of each insulation film so as to extend in the direction in which the insulation film extends. Therefore, the upper electrodes are electrically isolated on both sides of the grooves. Thus, matrix addressing using the intersecting, stripe-shaped upper and lower electrodes can be achieved.

According to the electroluminescence display panel of the present invention, a plurality of grooves may be formed in a surface of each insulation film so as to extend in the direction in which the insulation film extends. In this case, the number of portions for separating the upper electrodes are increased according to the number of the grooves, whereby the upper electrodes are more likely to be separated from each other. As a result, the reliability can be improved.

According to the electroluminescence display panel of the present invention, the insulation films may be formed from a water-resisting material. Therefore, moisture can be prevented from entering the organic film from the insulation films, whereby durability of the light-emitting elements can be improved.

According to the electroluminescence display panel of the present invention, the insulation films may be formed from a moisture-absorbing material. Therefore, moisture entering the organic film through the interface with the insulation films can be captured, whereby durability of the light-emitting elements can be improved.

According to the electroluminescence display panel of the present invention, the upper electrodes may be formed so as not to reach the respective ends of the grooves and the insulation films for separating the upper electrodes. Therefore, the upper electrodes can be reliably separated.

According to the electroluminescence display panel of the present invention, a recess(es) may be formed in a side surface of each insulation film. As a result, regardless of the direction in which an electrically conductive material is deposited, the upper electrodes can be readily separated on both sides of the insulation film.

According to the electroluminescence display panel of the present invention, each insulation film may be formed so as to have a cross sectional width broadening toward its bottom, whereby the upper electrodes are not in contact with the lower electrodes even when the upper electrodes are deposited on a portion other than the organic film. Moreover, the lowermost layer of each insulation film may protrude with respect to the other portion. As a result, the respective ends of the separated organic film and upper electrode are located on the protruding portion of the lowermost layer. Thus, even when the upper electrodes are located on a portion other than organic film, the upper electrodes can be reliably prevented from being in contact with the lower electrodes by the protruding portion of the lowermost layer.

According to the electroluminescence display panel of the present invention, the recess(es) can be formed efficiently.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An electroluminescence display panel, comprising:
   a substrate;
   a plurality of stripe-shaped lower electrodes formed adjacent and spaced apart from each other on the substrate so as to extend in a first direction;
   a plurality of stripe-shaped insulation films formed spaced apart from each other on the stripe-shaped lower electrodes so as to extend in a second direction which crosses the first direction, each of the stripe-shaped insulation films having a groove extending in the second direction;
   a plurality of organic films for providing electroluminescence formed over the plurality of stripe-shaped lower electrodes and the plurality of stripe-shaped insulation films, the plurality of organic films being separated from each other by the grooves of the stripe-shaped insulation films; and
   an upper electrode being formed from an electrically conductive film and formed on the organic films
   wherein the upper electrodes do not reach respective ends of the stripe-shaped insulation films, the ends of the stripe-shaped insulation films being located along the second direction.

2. An electroluminescence display panel according to claim 1, wherein a plurality of the grooves are formed in each of the stripe-shaped insulation films so as to extend in the second direction.

3. An electroluminescence display panel according to claim 1, wherein the stripe-shaped insulation films are formed from a water-resisting material.

4. An electroluminescence display panel according to claim 1, wherein the stripe-shaped insulation films are formed from a moisture-absorbing material.

5. A method for producing an electroluminescence display panel according to claim 1, wherein the upper electrodes are formed after the stripe-shaped lower electrodes and the stripe-shaped insulation films are sequentially formed on the substrate, the upper electrodes being formed by supplying the electrically conductive material onto the substrate at a prescribed angle from an axis perpendicular to a surface of the substrate.

6. A method for producing an electroluminescence display panel according to claim 1, wherein the groove is formed in a surface of each stripe-shaped insulation film by forming a groove in the surface of each stripe-shaped insulation film or by locating a pair of stripe-shaped insulation films close to each other.

7. A method for producing an electroluminescence display panel according to claim 1, wherein the stripe-shaped insulation films are formed by lifting off a resist formed before depositing the stripe-shaped insulation films.

8. An electroluminescence display panel, comprising:
   a substrate;
   a plurality of stripe-shaped lower electrodes formed spaced apart from each other on the substrate so as to extend in a first direction;
   a plurality of stripe-shaped insulation films formed spaced apart from each other on the stripe-shaped lower electrodes so as to extend in a second direction which is perpendicular to the first direction, at least one recess being formed in a side surface of each stripe-shaped insulation film;

an organic film for providing electroluminescence, the organic film being formed at least on each lower electrode located between the stripe-shaped insulation films which are adjacent to each other, and the stripe-shaped insulation films, and the organic film being separated by the recess; and an upper electrode being formed from an electrically conductive film and formed on the organic film, wherein the upper electrodes do not reach respective ends of the stripe-shaped insulation films, the ends of the stripe-shaped insulation films being located along the second direction.

9. An electroluminescence display panel according to claim 8, wherein each of the stripe-shaped insulation films has a cross sectional width broadening toward its bottom, and a protruding portion is formed at a lowermost portion of each of the stripe-shaped insulation films.

10. An electroluminescence display panel according to claim 8, wherein each of the stripe-shaped insulation films includes alternate layers of insulation materials having different etching rates.

11. An electroluminescence display panel according to claim 10, wherein a first alternate layer is formed from a water-resisting material and a second alternate layer is formed from a moisture-absorbing material.

12. An electroluminescence display panel according to claim 8, wherein at least one groove is formed in a surface of each stripe-shaped insulation film.

13. A method for producing an electroluminescence display panel according to claim 8, wherein the at least one recess is formed in a side surface of each stripe-shaped insulation film by etching.

14. A method for producing an electroluminescence display panel according to claim 13, wherein at least the upper electrodes are formed by supplying the electrically conductive material from a direction substantially perpendicular to a surface of the substrate.

15. An electroluminescence display panel, comprising:

a substrate;

a plurality of stripe-shaped lower electrodes formed spaced apart from each other on the substrate so as to extend in a first direction;

a plurality of stripe-shaped insulation films formed spaced apart from each other on the stripe-shaped lower electrodes so as to extend in a second direction which is perpendicular to the first direction at least one recess being formed in a side surface of each stripe-shaped insulation film;

an organic film for providing electroluminescence, the organic film being formed at least on each lower electrode located between the stripe-shaped insulation films which are adjacent to each other, and the stripe-shaped insulation films, and the organic film being separated by the recess; and an upper electrode being formed from an electrically conductive film and formed on the organic film, wherein each of the stripe-shaped insulation films has a cross sectional width broadening toward its bottom, and a protruding portion is formed at a lowermost portion of each of the stripe-shaped insulation films.

16. An electroluminescence display panel, comprising:

a substrate;

a plurality of stripe-shaped lower electrodes formed adjacent and spaced apart from each other on the substrate so as to extend in a first direction;

a plurality of stripe-shaped insulation films formed spaced apart from each other on the stripe-shaped lower electrodes so as to extend in a second direction which crosses the first direction, each of the stripe-shaped insulation films having a groove extending in the second direction free of any material therein so as to expose a surface of said plurality of striped-shaped electrodes;

a plurality of organic films for providing electroluminescence formed over the plurality of stripe-shaped lower electrodes and the plurality of stripe-shaped insulation films, the plurality of organic films being separated from each other by the grooves of the stripe-shaped insulation films; and an upper electrode being formed from an electrically conductive film and formed on thy organic film.

17. The electroluminescence display panel of claim 16, wherein each of said plurality of organic films comprise a lamination of an upper organic film layer and a lower organic film layer.

18. The electroluminescence display panel of claim 17, wherein said upper organic film is a light-emitting layer, and said lower organic film layer is a hole transfer layer.

19. An electroluminescence display panel, comprising:

a substrate;

a plurality of stripe-shaped lower electrodes formed spaced apart from each other on the substrate so as to extend in a first direction;

a plurality of stripe-shaped insulation films formed spaced apart from each other on the stripe-shaped lower electrodes so as to extend in a second direction which is perpendicular to the first direction, at least one recess being formed in a side surface of each stripe-shaped insulation film;

an organic film for providing electroluminescence, the organic film being formed at least on each lower electrode located between the stripe-shaped insulation films which are adjacent to each other and the stripe-shaped insulation films, wherein the organic film is separated by the at least one recess; and an upper electrode being formed from an electrically conductive film and formed on the organic film, wherein said upper electrode is separated from and does not contact any of said plurality of stripe-shaped insulation films.

20. An electroluminescence display panel according to claim 19, wherein said each of the stripe-shaped insulation films comprises a first layer of a water-resisting material and a second layer of a moisture-absorbing material.

21. An electroluminescence display panel according to claim 19, wherein said each of the stripe-shaped insulation films comprises alternating insulation layers having different etching rates.

* * * * *